US007038326B2

(12) United States Patent
Poulin

(10) Patent No.: US 7,038,326 B2
(45) Date of Patent: May 2, 2006

(54) IC CHIP PACKAGING FOR REDUCING BOND WIRE LENGTH

(75) Inventor: Grant Darcy Poulin, Carp (CA)

(73) Assignee: Research In Motion Limited, Waterloo (CA)

( * ) Notice: Subject to any disclaimer, the term of this patent is extended or adjusted under 35 U.S.C. 154(b) by 166 days.

(21) Appl. No.: 10/462,922

(22) Filed: Jun. 17, 2003

(65) Prior Publication Data

US 2003/0214052 A1 Nov. 20, 2003

Related U.S. Application Data

(63) Continuation of application No. 10/172,325, filed on Jun. 14, 2002, now Pat. No. 6,580,163.

(60) Provisional application No. 60/299,042, filed on Jun. 18, 2001.

(51) Int. Cl.
*H01L 23/48* (2006.01)
*H01L 23/52* (2006.01)
(52) U.S. Cl. ............... 257/784; 257/691; 257/786
(58) Field of Classification Search ........ 257/666, 257/678, 680, 684, 688, 690–693, 700, 777, 257/782, 784, 788, 786; 438/106, 117, 121
See application file for complete search history.

(56) References Cited

U.S. PATENT DOCUMENTS 5,457,340 A * 10/1995 Templeton, Jr. et al. .... 257/666
5,639,989 A * 6/1997 Higgins, III ............... 257/655
5,773,896 A * 6/1998 Fujimoto et al. ........... 257/777
5,920,117 A 7/1999 Sono et al.
6,046,495 A * 4/2000 Urushima .................. 257/668
6,160,705 A * 12/2000 Stearns et al. ............. 257/700
6,163,071 A * 12/2000 Yamamura ................ 257/691
6,268,648 B1 7/2001 Fukutomi et al.
6,294,966 B1 * 9/2001 Huang et al. .............. 257/728
6,376,904 B1 * 4/2002 Haba et al. ................ 257/686
6,448,659 B1 * 9/2002 Lee ........................... 257/777
6,580,163 B1 6/2003 Poulin
2002/0037598 A1 * 3/2002 Koh ........................... 257/728
2002/0145190 A1 * 10/2002 Fernandez et al. ......... 257/686

FOREIGN PATENT DOCUMENTS

JP 2001-102515 4/2001

* cited by examiner

*Primary Examiner*—Hung Vu
(74) *Attorney, Agent, or Firm*—Jones Day; Krishna K. Pathiyal; Robert C. Liang

(57) ABSTRACT

An integrated circuit packaging assembly for reducing the length of bond wires transmitting radio frequency signals is disclosed herein. The die is offset in the packaging to position a subset of its bond pads in close proximity to package bond pads to allow for shorter bond wires, which reduces the inductive reactance that is induced in longer wires by high frequency signals. The subset of the bond pads is used for RF transmissions, while the other bond pads are used for direct current and low frequency signals.

6 Claims, 3 Drawing Sheets

IC CHIP PACKAGING FOR REDUCING BOND WIRE LENGTH

CROSS-REFERENCE TO RELATED APPLICATION

This application is a continuation of U.S. application Ser. No. 10/172,325, filed on Jun. 14, 2002 now U.S. Pat. No. 6,580,163 and entitled "IC Chip Packaging For Reducing Bond Wire Length," which claimed priority from U.S. Provisional Application Ser. No. 60/299,042, filed on Jun. 18, 2001. The entire specification of these applications, including the drawing figures, are hereby incorporated into the present application by reference.

FIELD OF THE INVENTION

The present invention relates generally to integrated circuit (IC) packaging. More particularly, the present invention relates to the placement of the IC die in a package, to improve radio frequency (RF) signal transmission.

BACKGROUND OF THE INVENTION

In the art of IC manufacturing, it is common to encase an IC in a larger package, which is typically made of a ceramic. The IC, also referred to as a die, is typically placed in the centre of the package.

FIG. 1 illustrates a typical integrated circuit packaging assembly 100. Die 102 is placed in the centre of package 104. Die 102 has a plurality of die bond pads 106 through which an external interface is provided. Die bond pads 106 are connected to either package bond pads 108, or to a ground plane 110 that surrounds die 102 on package 104. The connection between die bond pads 106 and either package bond pads 108 or ground plane 110 is provided by bond wires 112. Package bond pads 108 typically connect to pins that are used to externally connect with a printed circuit board to integrate die 102 within a larger circuit. In this configuration bond wires 112 are generally symmetrical and approximately the same length.

Much progress has been made to miniaturise dies. Smaller dies allow for both increased speed and lowered costs. In many IC's common to the art, the interface between the IC and external components is made through a series of pins attached to the package. For a number of reasons, including pin and signal integrity there is a minimum pin size and pin spacing that must be respected. Thus, the number of pins required that interface with external components and the minimum pin size establish a minimum packaging size. Package size is typically determined based on a series of constraints set for the first production run of the IC package. Subsequent to the first production run, it is common for revisions to be made to the die design. These revisions often result in smaller die size as a result of improvements in manufacturing processes. However, this does not shrink the overall packaging size, which remains constant so that the board that houses the IC does not have to undergo a costly redesign. Bond wires are used to create an interface between the die and the pins of the larger packaging. This allows for the die to be shrunk while maintaining a standard packaging size, which allows newer components to replace older components without a board level redesign. By shrinking the die in this manner while maintaining packaging size, cost savings can be obtained without increased redesign costs.

Due to the high frequency of the transmitted signals, bond wires act like inductors. This inductance introduces an impedance, which at RF frequencies, results in reflection of the incident signal and a corresponding increase in insertion loss. The inductance is proportional to the length of the bond wire. Inductance in bond wires 112 impairs the propagation of RF signals from die 102 to the pins on package 104. Because packaging sizes cannot be altered without redesign of entire boards, minimising the distance between die bond pads and package bond pads requires locating die bond pads near their packaging counterparts. As the die shrinks this distance is increased if the dies remains positioned in the middle of the packaging. Conventional designs maintain a central die placement to allow simplified calculation of signal propagation times in timing dependant operations. Increased bond wire length is detrimental to RF signals that suffer from an induced inductance in the bond wires.

As stated above, the size of the chip packaging is fixed because of the number of pins. The pins are spaced apart a minimum distance, and as such this pin spacing defines the minimum length of a side of the package. Therefore, the size of the package cannot be simply reduced to equal the die size in order to improve RF signal performance.

It is, therefore, desirable to provide an integrated circuit packaging that reduces bond wire length to minimize cross talk and inductance in the bond wires, which will result in improved RF signal performance.

SUMMARY OF THE INVENTION

It is an object of the present invention to obviate or mitigate at least one disadvantage of previous integrated circuit packaging assemblies. It is a further object of the present invention to provide an integrated circuit packaging assembly with reduced bond wire length for RF signal transmission.

In a first aspect, the present invention provides an integrated circuit packaging assembly having a package, a ground plane, and integrated circuit and bond wires. In this first aspect the package has both external interface elements and bond pads electrically connected to each other. The ground plane is embedded in the package, for connecting to an electrical ground. The integrated circuit die has bond pads and is set into the package in a position offset from the center of the package. This offset position reduces the distance between a subset of the die bond pads and a subset of the package bond pads. The bond wires electrically connect the die bond pads to either the package bond pads or to the ground plane.

In a further embodiment, the integrated circuit packaging has pins as the external interface, and the die is circumscribed by the ground plane. In alternate embodiments the integrated circuit die is either unidirectionally or bi-directionally offset from the center of the package. In a further embodiment of the present invention at least one of the bond wires connecting the subset of the die bond pads and the subset of the package bond pads carries radio frequency signals. In other embodiments at least one of the bond wires connecting the die bond pads not in the subset of the die bond pads and the package bond pads not in the subset of the package bond pads carries either low frequency or direct current signals.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides an IC packaging assembly that minimises the length of bond wires used to transmit RF signals from the die to the pins.

In many radio frequency integrated circuits (RFIC) only a small set of the pins are used to transmit RF signals. For the sake of the present discussion RF signals will be used to denote all high frequency signals transmitted between the die and external connectors. It has been found that reducing the bond wire length for the RF signals either mitigates or overcomes problems related to bond wire inductance, even if wires used for non-RF signals are lengthened. This can be accomplished by offsetting the position of the die so that a subset of die bond pads are closer to the corresponding package bond pads. Assigning these bond pad pairs to RF signals provides shorter bond wire length to the signals that will induce the greatest inductance. The frequency dependent nature of the inductive reactance indicates that a significant advantage can be obtained by minimizing the length of bond wires carrying RF signals. Because the inductive reactance is negligible for low frequency signals, longer bond wires can be used to transmit low frequency or DC signals without adverse effect.

Figure 1:
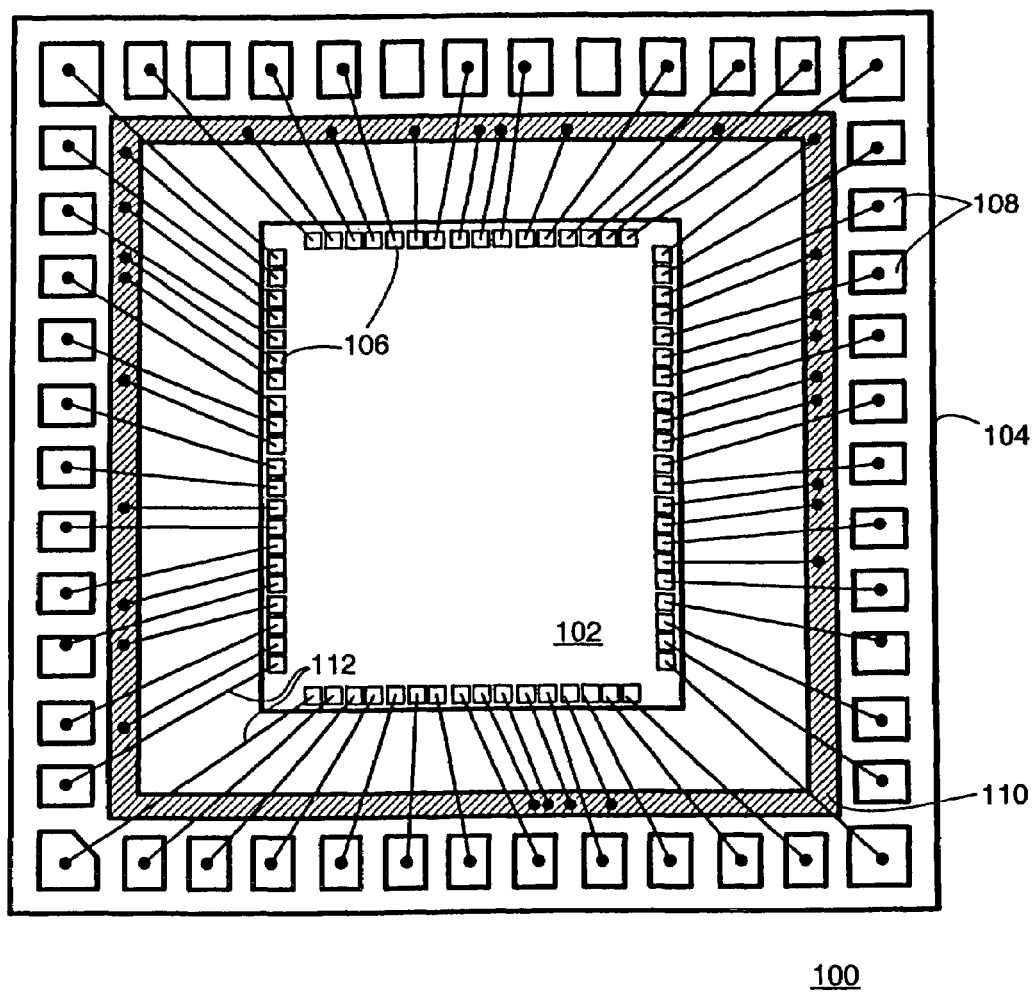
FIG. 1 is an illustration of an IC die and packaging assembly known in the prior art.
Figure 2:
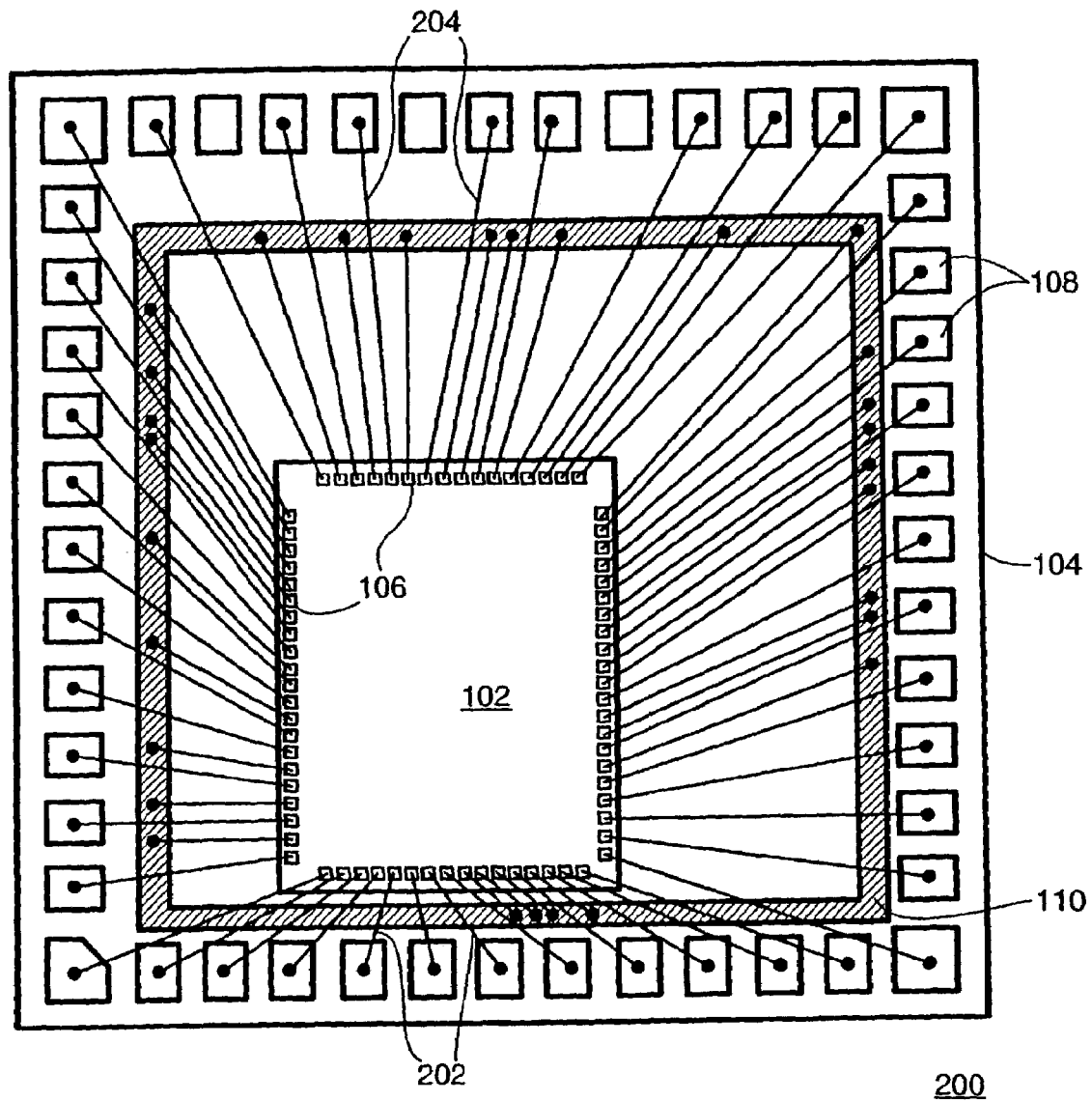
FIG. 2 is an illustration of an embodiment of the present invention illustrating the asymmetrical placement of the IC die in a packaging assembly.

FIG. 2 illustrates an embodiment of the present invention, wherein bond wires 202 used to transmit RF signals are minimized in length. The minimization is achieved by an asymmetrical placement of die 102 in package 104. IC packaging and assembly 200 as illustrated in FIG. 2 provides an assembly of the same size and pin configuration as that of FIG. 1. Die 102 is placed in a position offset from the center of package 104. The asymmetrical placement of die 102 allows die bond pads 106 to connect to package bond pads 108 using shorter bond wires 202 on one side of die 102. Longer bond wires 204 are used for low frequency or DC signals where inductance is less of a concern. Some die bond pads 106 are connected to ground plane 110 that circumscribes die 102. It is conceivable that in an embodiment of the present invention, ground plane 110 does not circumscribe die 102, though the presently preferred embodiment has die 102 circumscribed by ground plane 110.

Package bond pads 108 are used to connect to external interface elements such as pins and edge connectors. Reference in the specification to connections to pins should be understood as referring to any of a broader class of external interface elements used to connect the IC packaging assembly to other components.

Thus, in the design of die 102 all RF outputs can be positioned on sides of the offset die that are closer to the edge of package 104. This allows leads 202 used for RF signals to be minimized in length. An effect of minimizing the length of leads 202 used for RF signals is that leads 204 used to connect non-RF signals are lengthened. Because non-RF signals are typically low frequency or direct current signals, the inductive reactance in bond wires 204 is minimal.

In this example the bottom and left sides of die 102 are used for RF signals that are sensitive to inductance. The RF signals will, therefore, experience less inductance from the shorter bond wires 202.

The top and right sides of die 102 are preferably used for low frequency signals and DC power. This shifted design has particular use in transceiver chips, because most transceiver chips have low noise amplifiers (LNA) and mixers close together at one edge of the chip. These components are typically close together because outputs from the LNA are tied to the inputs of the mixers. The output from the mixers is a lower frequency signal, and therefore is much less sensitive to bond wire inductance.

Figure 3:
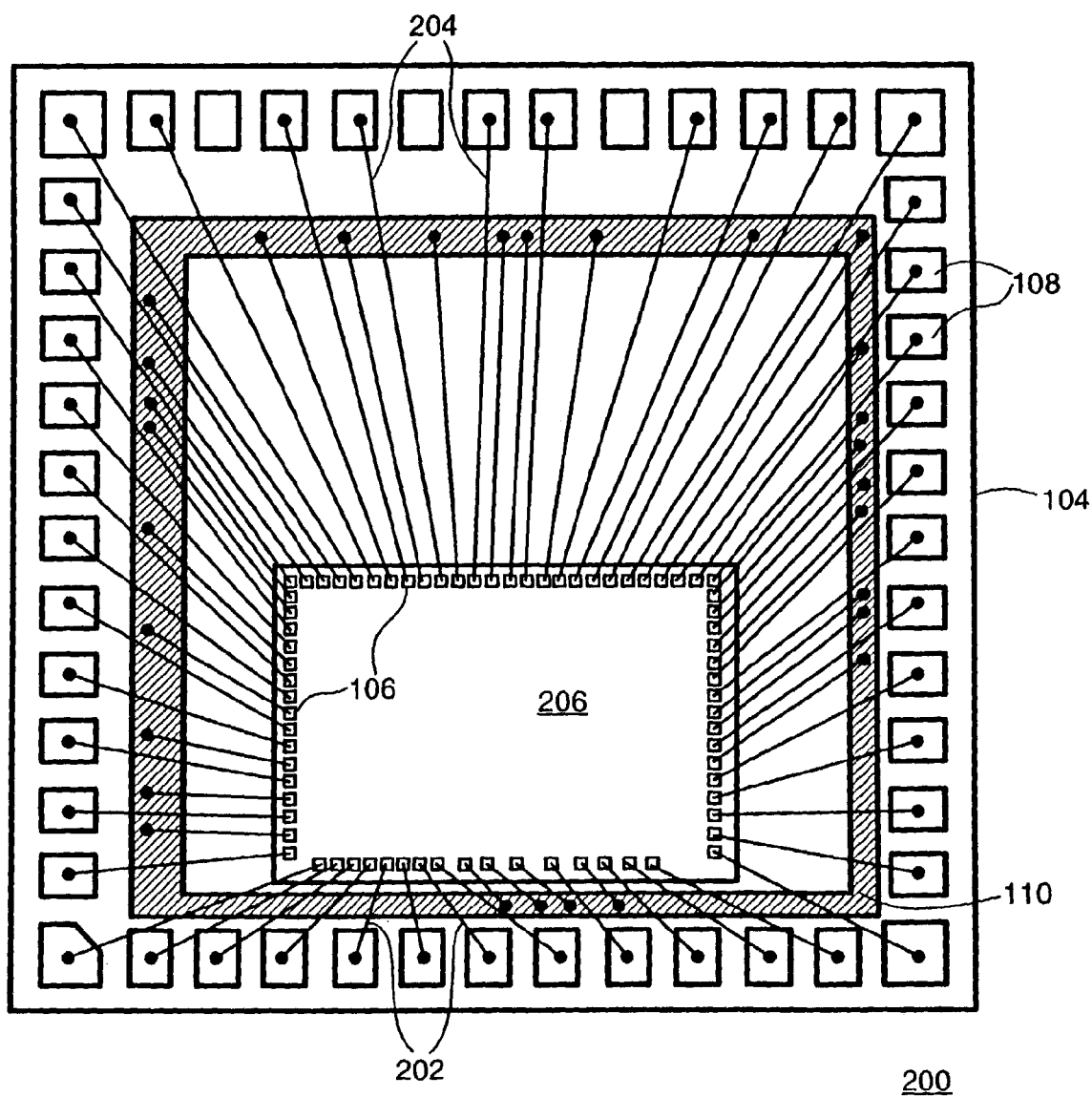
FIG. 3 is an illustration of an embodiment of the present invention illustrating the asymmetrical placement of the IC die in a packaging assembly

FIG. 3 illustrates an alternate embodiment of the present invention. In IC packaging 206, die 208 is redesigned to have a different shape than die 102. Die 208 is also offset from the center of package 104 in only one direction. Die bond pads 106 are connected to package bond pads 108 and ground plane 110 by short bond wires 202 and longer bond wires 204. Ground plane 110 circumscribes die 208 and is also inset in package 104.

One of skill in the art will appreciate that the use of unidirectionally offset die placement will provide similar benefits as will bi-directional offsetting. The embodiments of FIGS. 2 and 3 provide RF signals with short bond wire connections, while providing longer bond wires for the non-RF and DC signals. This reduces signal impairment caused by induced inductance in the bond wires.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A radio frequency integrated circuit package, comprising:
    a circuit package having external interface elements and package bond pads electrically connected to each other;
    a ground plane, embedded in the package, for connecting to an electrical ground;
    a radio frequency integrated circuit die having die bonding pads located on four sides of the die, the die bonding pads including a first set of die bonding pads for carrying radio frequency (RF) signals and a second set of bonding pads for carrying non-RF signals, the first set of die bonding pads being located on two sides of the die;
    bond wires for electrically connecting the die bond pads to either the package bond pads or to the ground plane; and
    the radio frequency integrated circuit die being offset in two directions from the center of the area encompassed by the package bond pads; to reduce the distance between the package bond pads and the first set of die bonding pads and thereby reduce the inductance of the bond wires connecting the first set of die bonding pads and the package bond pads.

2. The radio frequency integrated circuit package of claim 1, wherein the external interface elements are pins.

3. The radio frequency integrated circuit package of claim 1, wherein the integrated circuit die is circumscribed by the ground plane.

4. The radio frequency integrated circuit package of claim 1, wherein at least one of the bonding pads in the second set of bonding pads carries low frequency signals.

5. The radio frequency integrated circuit package of claim 1, wherein at least one of the bonding pads in the second set of bonding pads carries direct current signals.

6. The radio frequency integrated circuit pad of claim 1, wherein the radio frequency integrated circuit die is rectangular in shape.

* * * * *